United States Patent [19]

Ecker et al.

[11] Patent Number: 4,549,200
[45] Date of Patent: Oct. 22, 1985

[54] REPAIRABLE MULTI-LEVEL OVERLAY SYSTEM FOR SEMICONDUCTOR DEVICE

[75] Inventors: Mario E. Ecker, Poughkeepsie, N.Y.; Leonard T. Olson, Poyntelle, Pa.

[73] Assignee: International Business Machines Corporation, Armonk, N.Y.

[21] Appl. No.: 396,204

[22] Filed: Jul. 8, 1982

[51] Int. Cl.[4] .............................. H01L 27/12
[52] U.S. Cl. ........................ 357/80; 357/81; 357/74; 357/75; 174/68.5; 361/395; 361/397; 361/414
[58] Field of Search ............... 357/80, 74, 81, 75; 174/68.5; 361/395, 397, 414

[56] References Cited

U.S. PATENT DOCUMENTS

| | | | |
|---|---|---|---|
| 3,777,221 | 12/1973 | Tatusko et al. | 357/80 |
| 4,069,498 | 1/1978 | Joshi | 352/81 |
| 4,225,900 | 9/1980 | Ciccio et al. | 357/80 |
| 4,254,445 | 3/1981 | Ho | 357/80 |
| 4,288,841 | 9/1981 | Gogal | 357/75 |
| 4,322,778 | 3/1982 | Barbour et al. | 361/414 |
| 4,423,468 | 12/1983 | Gatto et al. | 361/414 |
| 4,472,762 | 9/1984 | Spinelli et al. | 174/68.5 |

OTHER PUBLICATIONS

Ecker et al., *IBM TDB*, vol. 22, No. 11, Apr. 80, p. 4852, "Low Profile . . . Means".

*Primary Examiner*—Martin H. Edlow
*Assistant Examiner*—Jerome Jackson, Jr.
*Attorney, Agent, or Firm*—Sughrue, Mion, Zinn, Macpeak & Seas

[57] ABSTRACT

A multi-level integrated circuit packaging system having a primary support frame, an array of secondary support frames mounted in said primary support frame and an array of single chip carriers associated with each secondary support frame. An integrated circuit is encapsulated in each single chip carrier, which may be a variety of carrier types which has an insulated wiring pattern with EC wells and delete lands. The secondary and primary support frames also have EC pads so that a change capability exists to any electrical signal path terminating on the chip.

18 Claims, 8 Drawing Figures

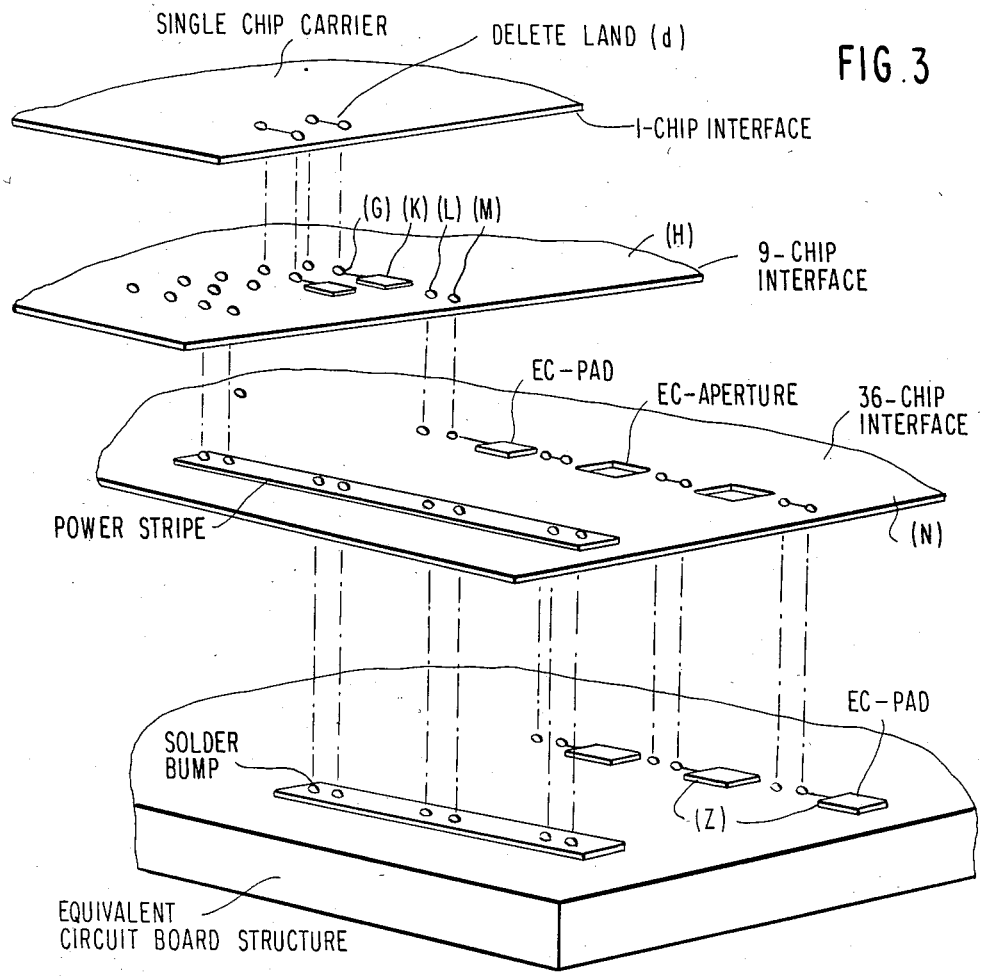
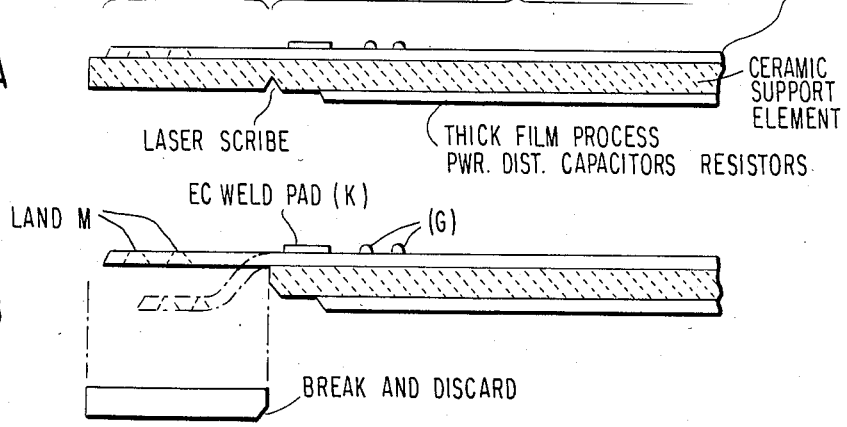

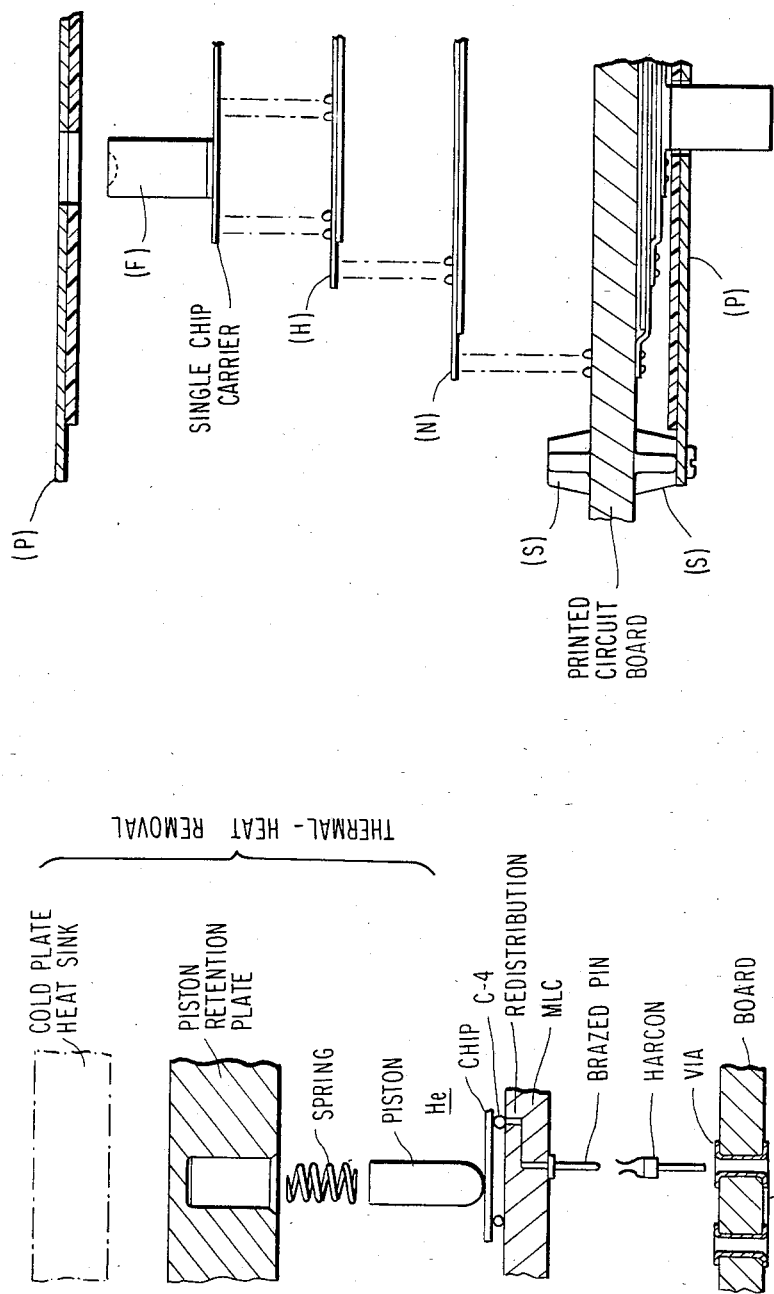

REPAIRABLE MULTI-LEVEL OVERLAY SYSTEM FOR SEMICONDUCTOR DEVICE

BACKGROUND OF THE INVENTION

1. Field of the Invention

This invention relates to integrated circuit semiconductor chips and in particular, to the repair of defective interconnection lines, semiconductor dies and/or subassemblies and improvement of the engineering design of the packaging device. Specifically, the invention relates to a repairable multi-level overlay wiring system for a multi-level integrated packaging structure.

2. Prior Art

A variety of packaging structures for mounting integrated circuit chips on substrates are known in the art. One common technique utilizes mounting of integrated circuit chips onto substrates which carry film or printed circuits. In some situations, the integrated circuit chip is mounted face upward, with the array of connection contact areas uppermost such that connection between the contact areas and the jumper lands on the substrate is made by thin jumper wires extending over the edges of the chip. This technique is shown in U.S. Pat. No. 3,082,327. The converse situation is also employed where the chip is mounted face downward and its contact areas are bonded to conductor lands on the substrate. This is shown in U.S. Pat. No. 3,292,240.

Multi-level overlay wiring systems are also used for mounting semiconductor chips. These systems employ a plurality of layers for power distribution, a plurality of layers for chip-to-chip connections, and a plurality of layers for intrachip connections. A composite package comprising a number of discrete wiring layers is generally known as a multi-layer ceramic (MLC). Defects in the conductors in some of the layers are generally repaired by means of socalled engineering changes in the semiconductor packages. These engineering changes (EC) have, in the past, employed complex techniques to make connections involving the use of discrete wires on various surfaces of the ceramic from an EC pad to the conductor in question. Such changes have been made by the use of fly wires which in practice are difficult to use given the dimensional constraints of the system. In extreme situations the MLC is unrepairable since the defect may not be circumvented.

As VLSI circuit dimensions tend to decrease with increased packing density, the removal of insulation from the ends of fly wires becomes an inefficient technique in terms of fabrication labor costs and the propensity of operator error tending to damage or render useless the MLC. Moreover, the technique is labor intensive requiring discrete soldering from point to point as the EC is made. Hence, the use of fly wires is not cost effective.

Another problem as circuit dimensions tend to decrease is the technique of joining the contact areas of the chip to the respective conductor lands or printed wires forming a multi-layer circuit. The chip itself includes a solid state device having a plurality of separate or structural integrated resistors, diodes, resistors and capacitors formed in the monolithic body of the semiconductor material which must be protected during the joining operation. The integrated circuit cannot readily be isolated from the conductor for couplings forming the I/O to the chip. Various packaging structures have been proposed in the prior art to provide the necessary cooling, thermal and mechanical shock resistance to this integrated circuit while at the same time providing sufficient reliability of any conductor coupling.

The state of the prior art with respect to such integrated circuit packaging structures is typified by the following representative prior art considered, vis-a-vis the problem solved by the present invention.

U.S. Pat. No. 3,325,882 relates to a method of interconnecting metal lands located on an insulating substrate to selected metal lands located on the solid state device. The method perceives the use of a removable powdered material in a cavity space disposed about the solid state device. This permits a bridging metal interconnection to be made between the solid state device and the substrate.

A different technique is shown in U.S. Pat. No. 3,614,832. In this prior art patent, a plurality of connections from electrically conductive lands on an insulating substrate to the contacts of a solid state device are formed in one operation by using a decal including a backing plate with a plurality of conductive strips which can be adhered to the plate by means of a soluble adhesive. The decal is positioned over a substrate to which the solid state device has been positioned with the strips in registration with respective contacts and lands. The strips are brought into contact with respective contact and land surface portions and then subjected to heat and pressure treatment so that bonding between the strips and land surface portions occurs. Then, the decal backing plate may be removed from the strips, for example, by dissolving the adhesive thereby leaving the strips firmly bonded to the contacts and lands bridging the space therebetween.

U.S. Pat. No. 3,605,063 relates to a system for interconnecting electrical components although not of VLSI size. In accordance with this invention, printed circuit cards are used having individual electrical components mounted on the edge with electrical interconnection between the cards achieved using wiring cards of a specific design sandwiched between the component cards. Each of the component and wiring cards have on one side a plurality of paired and electrically connected conductive pads arranged in a matrix. One pad of each pair of pads is provided with a plated through hole to the other side of the card to a similar pad on that side. In the case of component cards, each pad pair is electrically isolated from the other pair and conductive paths connect the leads of the component to selected pad pairs. Different types of wiring cards are used to establish either vertical or horizontal conductive paths.

U.S. Pat. No. 3,662,230 relates to a interconnection system utilizing conductive patterns bonded to thin flexible insulating films. A packaging system as disclosed in that patent employs one or more semiconductor chips each having metal contact pads on at least one face. A rigid support is provided for the semiconductor chip and also large leads are used to connect the package device to an external circuit. Thin metallic film strips are bonded to a thin flexible dielectric sheet for support. The set of metal strips interconnects the contact paths of the semiconductor chips and selected leads to electrically interconnect the semiconductor device and the leads. If a plurality of semiconductor devices are used, a plurality of dielectric sheets are stacked with electrical connections made between the different layers of metal film strips through openings in the dielectric sheets.

U.S. Pat. No. 3,702,025 defines a system of interconnecting circuits on a substrate in a discretionary manner by first probing cells that are mounted on the substrate to determine which are defective or inoperative. The cells are covered by a dielectric layer, a second layer connection pattern is then formed and connections are made to contacts on only the good cells with the connection patterns skipping across defective cells.

U.S. Pat. No. 3,757,175 relates to a system of coplanar connections to semiconductor chips mounted on a single substrate by using a rigid dielectric substrate for supporting a number of semiconductor chips. The chips have metallized contact electrodes and an insulating material overlies one surface of the substrate in which the chips are embedded. The substrate has conductor strips with terminal electrodes to be used for connecting the contact electrodes. The chips are bonded to the substrate with the contact electrodes in registration with the terminal electrodes and with the contact and terminal electrodes contiguous with the surface of the insulating material. Metallization is then deposited on the surface of the insulating material extending between the contact and terminal electrodes to form electrical connections to the chips.

U.S. Pat. No. 3,780,352 also relates to a semiconductor interconnecting system utilizing conductive patterns bonded to thin flexible insulating films. In this patent, a packaging system for a plurality of semiconductor chips each having metal contact pads on at least one face is disclosed. A rigid support is provided for the chips and also for a series of leads which are used to connect the package device to an external circuit. Thin metallic film strips are bonded to a thin flexible dielectric sheet for support. The metal strips in the form of sets then interconnect the contact pads on the semiconductor chips to selected leads and thereby establish electrical interconnections of the semiconductor device and the leads. A plurality of dielectric sheets can be stacked and interconnections then made between different layers of thin metal strips through openings in the dielectric sheets if couplings to a plurality of semiconductor devices are to be established.

U.S. Pat. No. 3,781,596 also deals with packaging of semiconductors by means of flexible carriers. In this patent, the carrier comprises a film base having a pattern of discretionary conductors and bonding pads. The film acts as a supporting layer for the conductor pattern which itself is applied to one surface by selective deposition or etching of coatings in raised contact areas. The semiconductor chips are mounted so that the active chip surface is bonded to the carrier pads. Thereafter, the chip is connected to the circuitry of the substrate by the discretionary carrier conductor pattern. The carrier pads serve to provide discrete bonding areas for reliable bonding and prevent shorting by raising the carrier conductors of the active surface of the chip.

U.S. Pat. No. 3,978,578 relates to packaging of semiconductor devices utilizing a polyimide film with selected areas etched from the surface of the wafer. The etching exposes electrical contact areas of each of the semiconductor devices. The integrated circuit devices are then separated from the wafer and attached to a support. Electrical continuity is established by using bonding wires to couple the contact areas on each of the device with electrical conductors. The device is then coated with a second layer of polyimide film.

U.S. Pat. No. 4,072,982 discloses a semiconductor circuit having a plurality of plate-shaped semiconductor islands supported on a dielectric carrier. Doping layers are provided on the island and thin film deposits on selected areas of the dielectric carrier are used to interconnect selected islands.

U.S. Pat. No. 4,251,852, an invention by the same inventors herein, relates to a packaging structure for integrated circuits wherein a plurality of circuit chips are mounted on a number of membrane-like insulating members. Each of the membrane-like members provide multi-level wiring and interconnections between the chip or chips and a secondary wiring structure. The insulating membrane is material such as polyimide or parylene and by photoresist and etching procedures a number of openings in the membrane are provided over an active area of a particular chip such that by subsequent masking and metal deposition steps, metallic lands are provided to form electrical paths between the openings over a chip and openings for a secondary structure contact grid. A second thin layer of membrane material is then provided over the metallization of the first layer and is similarly processed to provide an identical set of openings in the secondary grid structure for a second chip. Accordingly, the interconnection of two memory chips to a common set of contact openings with levels of metal lands insulated from each other is accomplished such that the contact openings in both levels conform to a predetermined format.

U.S. Pat. No. 4,254,445 relates to an EC repair of VLSI devices. An array of chips are mounted on a substrate such that about each chip area a large peripheral area is defined for EC pads and for testing. Prefabricated thin film interconnection EC lines of varying lengths are preformed in the rows and columns between the peripheral areas surrounding each of the chips. These printed wire EC lines and pads are designed to have different lengths and are laid out so that the EC pads for different chips can be interconnected at the discretion of the designer. The '445 patent perceives a general hierarchy of EC lines having a multi-tier of long vertical lines of parallel shorter lines, a series of horizontal lines and fly wire interconnections. This hierarchy uses a generally orthogonal structure such that fly wire connections are extremely short.

In other prior art generally considered to define the background of this invention includes IBM Technical Disclosure Bulletins: Vol. 11, No. 3, August, 1968, pp. 309–310; Vol. 14, No. 10, March, 1972, p. 3090; Vol. 16, No. 3, August, 1973, p. 758; Vol. 18, No. 11, April, 1976, p. 3591; Vol. 21, No. 2, July, 1978, pp. 569–573; Vol. 21, No. 11, April, 1979, p. 4425; and Vol. 22, No. 11, April, 1980, pp. 4852–4854.

While the prior art is replete with a number of techniques for accomplishing engineering changes on various levels, none are believed to have specific application for a multi-layer ceramic (MLC) structure. In the context of such a complex semiconductor device, engineering change requirements may exist at different tier levels. For example, change may be required on a single chip carrier or, at a second level on a first tier carrier for an array of chips. A third level of engineering change may be required on a multi-chip carrier wherein each tier forms one block of a multi-chip array. Accordingly, a requirement exists for defining a system of multi-level engineering change capability to any electrical signal path terminating on, for example, an encapsulated chip, a tape automated bond chip carrier, leadless chip carrier and a face bonded chip.

SUMMARY OF INVENTION

Given the deficiencies of the prior art, it is an object of the present invention to define a repairable multi-level overlay system for semiconductor dies contained within a variety of chip carrier types.

It is another object of this invention to provide a packaging system for integrated circuit chips on continually integrated wiring levels, each level having engineering change capacity.

Yet another object of this invention is to define a system of packaging integrated circuit chips so that successive joining of levels with the capability of engineering change exist between various levels of a multi-level wiring medium.

A further object of this invention is to define a packaging system capable of handling a mix of integrated circuit configurations on a multi-chip carrier.

These and other objects of this invention are achieved in a planar multi-level integrated packaging structure that supports and electrically interconnects a plurality of integrated circuit chips. Specifically, the packaging structure utilizes a primary planar support frame having an array of support areas disposed in a geometric relationship. A wiring pattern is formed on the primary planar support frame to provide connection contacts and EC wiring channels and contacts within the space between the areas on the frame. A plurality of secondary planar support frames, of a number equal to the areas defining the array on the primary planar support frame, are positioned respectively within each of the areas. The configuration of each of the secondary planar support frames is slightly less than that of each of the areas forming the array on the primary planar support frame. Secondary areas are formed in each of the secondary planar support frames. An array of secondary areas of greater number than the primary areas are formed in a geometric pattern in each of the secondary planar support frames. Each of the secondary planar support frames contain a wiring pattern to provide connection contacts and engineering wiring channels and contacts in the space between each of the areas on each of the planar support frames.

In each of the secondary areas a planar single chip carrier is disposed, each of the chip carriers containing at least one integrated circuit chip supported thereon and connected to that area. The chip carriers are respectively positioned within each of the secondary areas and have an array of exposed connection contacts. Each of the planar single chip carriers contain wiring for electrically interconnecting the integrated circuit chip supported thereon to the array of exposed connection contacts on the associated single chip carrier.

A plurality of interconnection conductors are used for first connecting each of the single chip carriers to predetermined connection contacts on one of the secondary planar support frames. Secondary connectors are used for connecting specified predetermined contacts of each of the secondary planar support frames to predetermined connection contacts on the primary planar support frame. Accordingly, by this multiple, multi-level wiring technique, repair and replacement of individual chip carriers with engineering wiring changes is greatly facilitated.

In accordance with this invention, each of the single chip carriers comprises an integrated circuit chip having an array of electrical contacts and a thin flexible membrane insulating member containing a wiring pattern. The wiring pattern of each of the membrane-like insulating members interconnects the array of electrical contacts of the membrane-like member and the array of electrical contacts of the integrated circuit chip positioned thereon.

This invention will be described in greater detail by referring to the accompanying drawing and the description of the preferred embodiment that follows.

BRIEF DESCRIPTION OF THE DRAWINGS

FIG. 3 is an exploded perspective view showing the multilevel interface wiring hierarchy in accordance with the present invention;

FIG. 4A is an exploded elevation view comparing a thermal conduction module with the present invention and showing a modification of the invention; and FIG. 4B is a tiered view of a multilevel wiring film arrangement of this invention; and FIG. 5A and 5B are exploded elevation views showing another modification employing a thin ceramic support for additional mechanical support and additional printed wiring capability.

DESCRIPTION OF THE PREFERRED EMBODIMENTS

Figure 1:
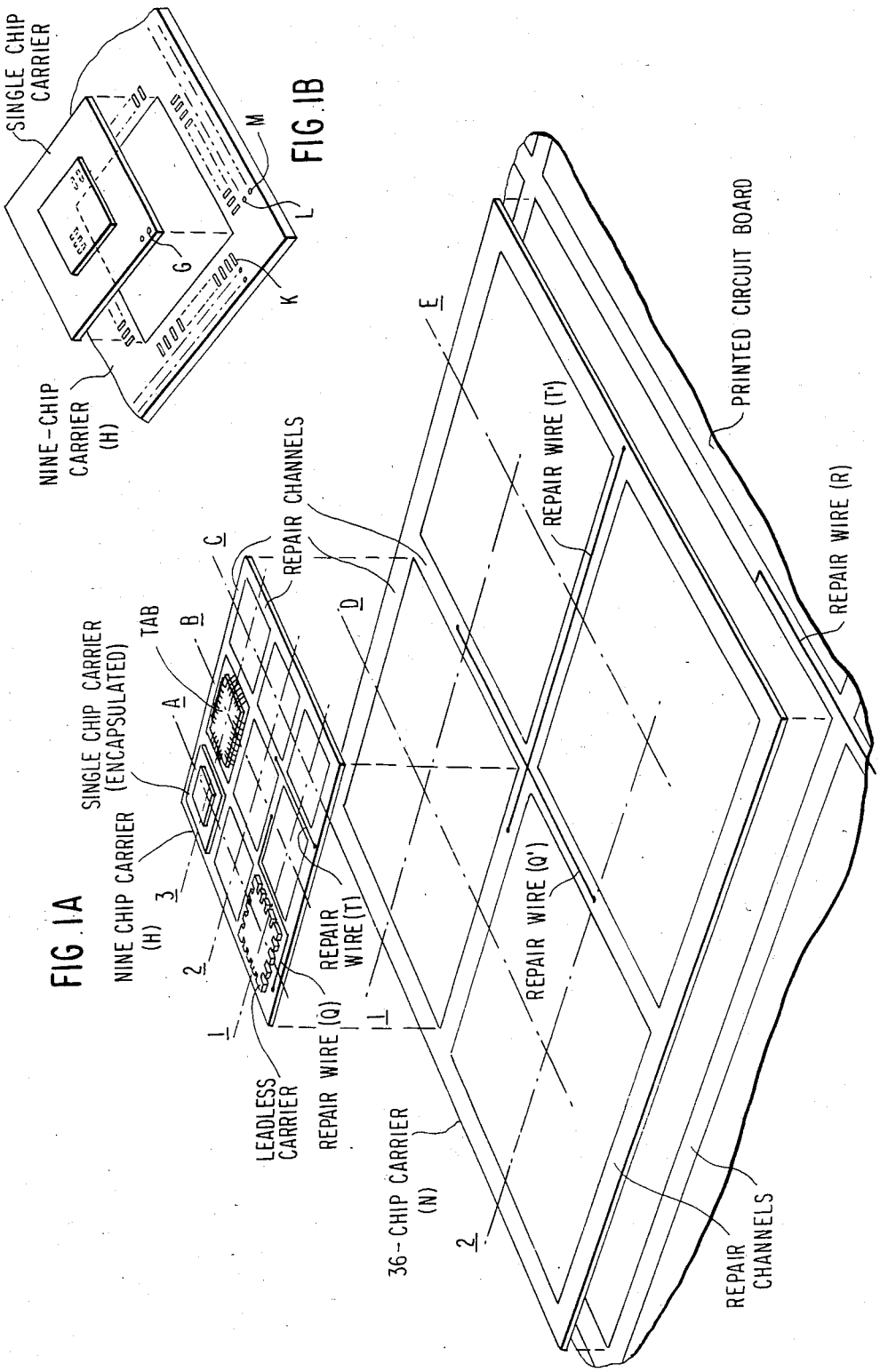
FIG. 1A is an exploded perspective view of the system of the present invention for effectuating multi-level wiring repair.
FIG. 1B is an exploded perspective view showing a portion of the nine chip carrier.
Figure 2:
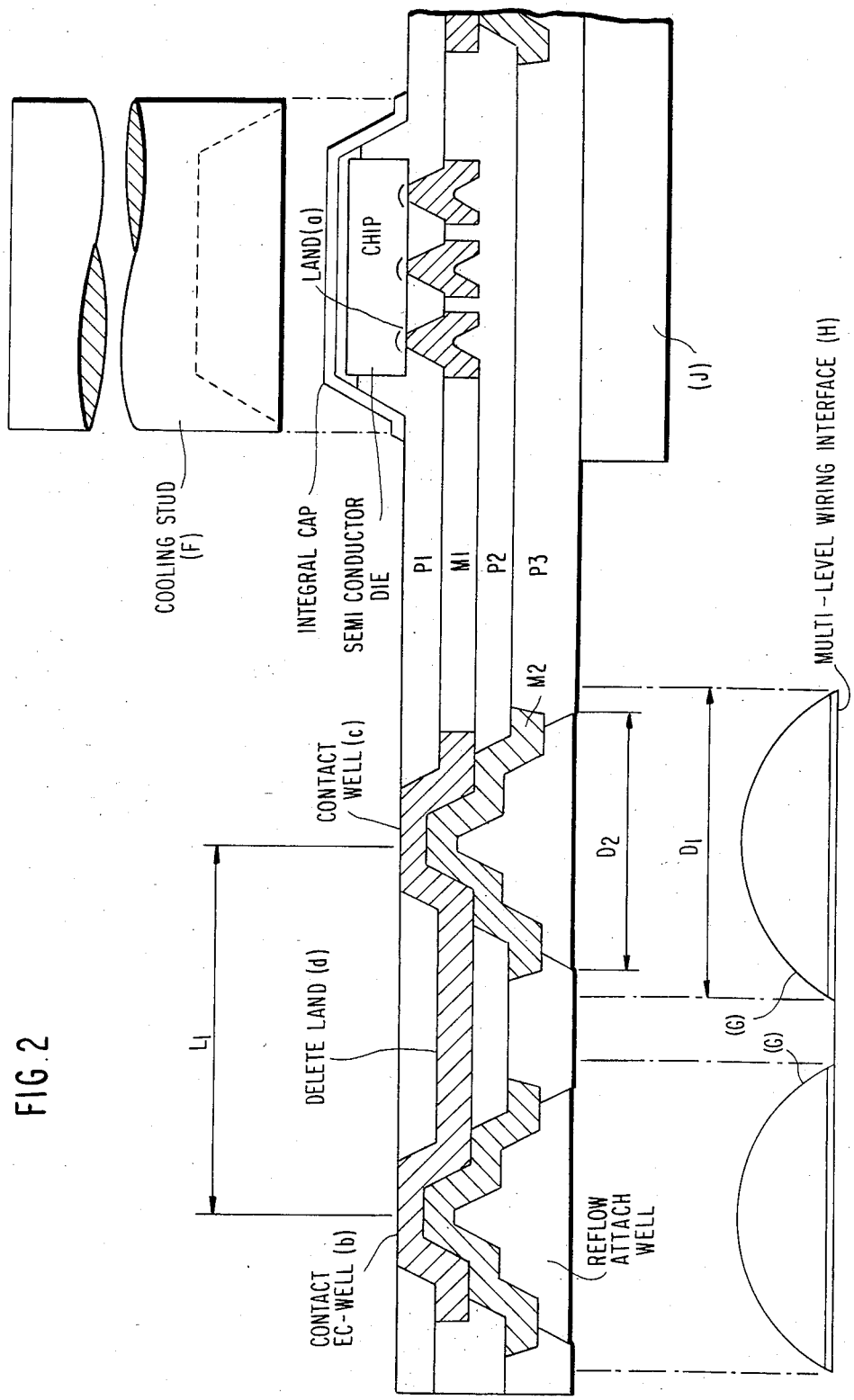
FIG. 2 is an elevation view of the chip carrier forming a portion of the module shown in FIG. 1.

The present invention is directed to a repairable multi-level overlay wiring system for semiconductor chips. As an example of the capability offered by the present invention, it will be described by defining a thermal conduction module (TCM). This multi-level semiconductor device is exceptionally complicated and accordingly, by defining the invention in the context of that system, other configurations which are less complex will be apparent to those of working skill in this technology. Referring now to FIGS. 1 and 2, the basic concepts of this invention will be described.

As shown in FIG. 1A, a semiconductor array is defined on a printed circuit board. The array employs an intermediate 9 chip carrier having a 3×3 matrix of single chip carriers. The 9 chip carrier is then itself arrayed in a 2×2 configuration on a 36 chip carrier. As shown in FIG. 1A, multi-level wiring repair capability is established by utilizing a repair wire system on the 9 chip carrier, a second repair wire capability on the 36 chip carrier and a third repair wire capability on the printed circuit board.

The invention is not limited to a specific type of device carried by the 9 chip carrier. The invention, as shown in FIG. 1A is applicable to a leadless carrier, or tape automated bond carrier or a mixture thereof. These particular types of carriers are well known in the art. Also, although not shown, a flip-chip can also be employed on the 9-chip carrier. Such devices are described in L.S. Goldman, "Geometric Optimization of Controlled Collapse Interconnections", IBM J. Res. & Dev. Vol. 13, No. 3, p. 251 et seq., May, 1969. FIG. 1A shows a mixture of these carrier types and it is within the scope of this invention to use either a mixture of carriers or a matrix or a single type.

As shown in FIG. 2, a semiconductor die is encapsulated within a multi-level wiring film and an integral metal cap. FIG. 2 illustrates a crosssection of a particular encapsulated single chip carrier shown in FIG. 1A. As shown in FIG. 2, a pair of contact wells (b), (c) are located on the outer perimeter of the wiring film. The contact wells are located with a fixed separation $L_1$. Each signal circuit path from the semiconductor die is configured so that a pair of contact wells are serially disposed in the circuit path at that fixed separation. FIG. 2 shows the chip carrier as having a series of discrete levels, polyimide/metal denoted as levels P1-P3 and M1-M2. The circuit path in FIG. 2 is defined, that is, wired from the chip to a land (a) through metallization layer $M_1$ to the EC well (c) and then to the contact well (b). Metallization in layer $M_1$ denoted as delete land (d) defines the circuit path from the EC-well (c) to the contact well (b). It is understood that the semiconductor die may have a large number of signal, I/O paths and therefore the contact well pairs are equally distributed along the outer edges of the wiring film portion of the encapsulated chip structure. FIG. 1B broadly shows a series of via pairs which would be used to define the contact wells about the periphery of the encapsulated chip. While the pairs are shown along one side, it is understood that the via pairs would exist about the total periphery of the encapsulated chip.

As shown in FIG. 2, a cylindrical cooling stud (F) is fittingly attached over the integral metallic cap. Attachment of the cooling stud to the cap may be by reflow solder, epoxy bonding or pressure attachment with thermal grease to the surface of the cap. As is understood in this technology, an appropriate cooling stud support and positioning structure would be provided depending on the attachment technique to be employed.

FIG. 2 also illustrates the multi-level wiring path. Specifically, complimentary attachment protrusions in the forms of hemispherical protrusions (G) are located on a wiring film layer (H). The protrusions (G) are separated by a distance (L) identical to that of the centerline distance between the contact wells. The hemispherical protrusions (G) may be formed by screening an appropriate volume of a suitable alloy on a pad of predetermined size. The metal of choice may be, for example, Pb/Sn alloy employed on the wiring film (H). Pad size and solder volume determine the height and shape of the protrusions.

As shown in FIG. 2, the contact well (C) has a diameter $D_2$ which is determined by the etching process employed at the polyimide level ($P_3$). To control the separation between the surface of the polyimide level ($P_3$) and the surface of the wiring film (H) the well diameter ($D_2$) must be less than the hemispherical protrusion diameter ($D_1$). Stated differently, $D_1 > D_2$ and the ratio of $D_2/D_1 < 1$ will therefore result in a limited physical engagement so that the contact well (C) resting on the protrusion (G) at a chord ($D_2$) will effectuate a separation between layer $P_3$ and the wiring interface H. Preferably the separation is sufficient so that the reflow attached well (C) to the protrusion (G) will have a vertical distance to allow adequate solder flux cleanout. As shown in FIG. 2, a bond film (J) is utilized to provide mechanical support for the encapsulated chip structure. The thickness of the film (J) is equal to that of the separation between the lower surface of $P_3$ and the wiring interface (H) thereby limiting moisture entrapment after processing for flux rinse and drying. The reflow attached well is screen filled with the solder microcream having a melting temperature lower than that of the Pb/Sn alloy used to define the protrusion. Accordingly, the reflow of the solder microcream will not melt the hemispherical protrusion but provides a good solder bond. Such a procedure is reversible. Moreover, since the reflow attached well and the hemispherical protrusions are photolithographically process dependent, accurate placement and geometric control is possible.

In accordance with the present invention, the repair capability of this system resides in the use of a multilevel design. For example, the delete land region (d) shown in FIG. 2 may be laser cut in the encapsulated chip structure. Similarly, the EC wire bond contact well pad (b) and the circuit path segments are disposed on the supporting wiring film (H). As such, this system allows the permissible removal of a defective encapsulated chip structure without disturbing the EC wire group.

FIG. 1B, includes a portion of the wiring interface layer (H) on the 9 chip carrier in an exploded portion of that Figure. One chip site is shown. Each chip site contains a set of corresponding hemispherical protrusions (G) as shown in FIG. 2. It is understood that these protrusions are disposed in a regular pattern at each chip site. A set of EC pads are disposed around the protrusion pair with each EC pad connected to a distinct EC protrusion. As shown in the exploded view, a well pair (L) and (M) is defined in a regular pattern on each side of the wiring interface. Each complimenting wire net protrusion is connected to a conductive path that either connects one or more wire net protrusions (G) or to the well pair (L) and (M). A wiring net from a protrusion (G) to a protrusion (G) therefore represents a connection that is chip-to-chip. This intrachip wiring is accomplished by a pair of orthogonal wiring planes. Such wiring planes may be fabricated by techniques known in the technology such as utilizing photolithography with polyimide as an insulating material. Accordingly, as established in this art, fine lines with transmission line characteristics and densities on the order of 330 lines per inch are possible.

A wiring net between multi-levels is established from a protrusion (G) to the wells (L) and (M). This connection represents a wiring net leaving the multilevel wiring film (H) and transferring to the next multi-level wiring interface not shown. The circuit wells (L) and (M) are similar to those disposed on the single chip carrier, that is, similar to wells (B) and (C) except that the spacing density is increased.

Wiring changes which are performed through the contact wells (b) and (c) and pads (K) define a wiring change in chip-to-chip wiring for any of the 9 chips supported by the wiring interface (H). Wiring between the two interfaces (H) and an adjacent one (N) may be laser deleted between the wells (L) and (M).

As shown in FIG. 1A, the multi-level wiring interface (N) is divided into four quadrants. Each quadrant accepts a multilevel wiring interface (H) and its 9 encapsulated chip structures. Accordingly, 36 chip structures supported by a single multilevel interface (N). Although not shown in FIG. 1, the peripheral patterns on the interface (N) are essentially the same as that shown for interface (H). That is, the edge bond, the EC pad and the delete region is nearly the same. There are some variations, for example, in the interface (H) multiple rows of hemispherical protrusions, EC pads and a system of etched apertures exist. In the case of the interface (N), a multiple row capability is disposed along the edges. A slightly higher I/O capability exists. The interface level (N) is not intended in this system to be a replaceable level and as a result, apertures may be etched into the level to allow access to EC pads which exist on the printed circuit board level immediately below it.

Accordingly, as shown in FIGS. 1 and 2, an electrical path from the chip shown in FIG. 2 is wired to the connection point (B) to the connection (C) through the delete land (d). The connection points (b) and (c) are in turn electrically connected via protrusions (G) on the next carrier level. The outer connection point (b)-(G) is connected to a pad located in the repair channel of the next higher carrier level. The interconnection point (c)-(G) is routed into the X-Y wiring plane of the lower carrier level.

Accordingly, to effectuate a change in wiring, the delete land (d) is severed, for example, by use of a laser. The wiring of the connection point (c)-(G) is then disregarded. The pad of the connection point (b)-(G) is located in the repair channel on the next carrier level. Following the laser delete operation, wires may be thermo-compression bonded to the proper pads in the repair channels in order to create a new electrical path. The repair wires are shown in FIG. 1.

FIG. 1A illustrates several examples of various repair capabilities of this invention. An alpha numeric code as shown is employed to identify any chip carrier site. On the 9 chip carrier, the site matrix is defined by 1, 2, 3×A,B,C while on the 36 chip carrier the site matrix is defined by 1, 2×D,E. Hence the site in any carrier (A-E) existing in any row (1-3) can be identified. Repair wires Q, Q', T, T' and R are also illustrated.

To effectuate a change in the printed circuit path between two chip sites, for example, A1 and B2, both on the 9 chip carrier, the delete lands (d) on the respective single chip carriers would be severed. The use of a laser to effect such cutting is well known and is employed to excise the printed electrically conductive path joining the two chip carriers at their respective circuit wells (C). The chip carrier signal will now only be connected solely to their respective EC-Pads (K) through the outer EC-well (b) (FIG. 2) and the solder bump (G). As shown in FIG. 1 a repair wire (Q) may be thermo-compression bonded to the respective pads (K) and the wire (Q) routed between the chips. A change between any of the 9 chip carriers may be similarly effectuated by a repair wire such as (Q').

A second repair option could be between chip carrier site 2B and a spare pad (K) disposed along the edge of the 9 chip carrier (H). A laser delete operation would be performed at the delete land (d) of chip site 2B. A repair wire (T) is then routed as shown in FIG. 1 and thermo-compression bonded to the appropriate pads (K). On the 9 chip carrier a similar operation may be performed using repair wire (T'). In order to provide changes between 36 chip carriers a repair wire (R) may be employed.

This tiered repair capability is also illustrated in FIG. 3. FIG. 3 shows an exploded view of the various elements involved in the multi-level interface used in accordance with the present invention. At the first film level, the encapsulated chip employs two levels of fine line metal patterns to perform chip I/O fanout and power distribution. The delete land (d) between contact wells (b) and (c) is shown on the single chip carrier.

The second film level employs two levels of fine line metal patterns and is employed for power distribution and intra-connection of the 9 chip group. The relationship of the protrusion (G) to the delete land is clearly shown.

At the third film level, two levels of fine line metal patterns are employed for intra-connection of a set of four 9 chip groups. The EC pads and EC apertures are shown on this 36 chip interface (N). Also shown is the power stripe coupling to the protrusions on the 9 chip interface (H). The equivalent printed board structure provides wiring between groups of the 36 chips. Accordingly, three film levels having 6 metal layers are used in this MLC structure. The wiring for the 36 chip structure is distributed through two plane pairs and is provided with three levels of laser delete and signal net repair via miniature thermo-compression bonded wires.

In accordance with this preferred embodiment of the invention, a single chip on the single chip carrier or an entire 9 chip group may be designated for replacement. Replacement is effectuated by use of, for example, vacuum head with an appropriate perimeter mounted heating element. The multi-level wiring films are thin enough to permit viewing of embedded optical alignment marks to allow accurate placement of the head vis-a-vis that module designated for replacement.

A comparison of the multi-level repairable system in accordance with this invention is compared in FIG. 4 with a known TCM. The known system is shown in the exploded elevation view of FIG. 4A. This device is also defined in "Electronics", June 16, 1982, p. 145. The equivalent embodiment utilizing the concepts of this invention shown in FIG. 4B. FIG. 4B also shows a first modification of the invention. Given the tiered multi-level wiring film arrangement shown in FIG. 4B, encapsulated chip groups are mounted to both surfaces of the printed circuit board. The bottom surface shows the assembled multi-tiered arrangement while the top surface has the layers exploded away to show the individual components. Cooling studs are directly attached to provide low thermal resistance pads into the immediate airflow stream. As shown, access for repair is effectuated on both surfaces with all nets addressable at multiple repair points. The laser delete regions and the EC wire bond regions are clearly shown, vis-a-vis the completed assembly. This is in contrast with the known system having a mounting on one side of the board.

It has been established that the dielectric constant for chip-to-chip is approximately 3.5 or lower. The 36 group to 36 group dielectric constant through the circuit board is approximately 4.6.

By using multi-pad vias through the board, the number of drilled holes is reduced. Moreover, greater separation between those drilled holes exists thereby reducing the IR drops and providing a more relaxed transmission line tolerance.

The invention also provides extreme expansivity differential compensation since it can employ direct vapor deposition of cr/cu/cr to the ball-limiting metallization pad. This extends along a membrane-like structure to a solderable connection point on the membrane but may extend beyond the edge of the silicon chip.

In contrast, the TCM shown in FIG. 4A employs five levels of the MLC for the chip footprint transformation to the wiring format. The multi-level interface in accordance with the present invention requires only two layers of polyimide. The dielectric constant of the polyimide is 3.5 as opposed to 9.4 for the ceramic in MLC. As such, improvements in capacitance loading and signal propagation delays are effectuated by the multi-level interface concept of the present invention.

The TCM employs 6 plane pairs for wiring support. Equivalent wiring capacity is achieved in accordance with the present invention by using two photolithographic process plane pairs, the 9 and 36 chip carriers (H) and (N).

The TCM requires a Harcon connector that in turn requires two via holes per signal contact element to effect a delete and EC capability on the far side of the circuit board. The multi-level interface of the present invention employs an integral multi-level repair capability that facilitates the placement of packaged electronics on both surfaces of the board.

The concept of placement of the multi-level structure on both sides, that is, in an opposed relationship of the printed circuit board forms a first modification of this invention. This is shown in FIG. 4B. That Figure illustrates a dual surface embodiment of the thin film structure shown in FIG. 3. An assembly of film members comprising a single chip carrier of the 9 chip carrier (H) and the 36 chip carrier (N) are disposed on the printed circuit board on both sides. A retainer plate covers the array of cooling studs (F) and is held in place by screws anchored in a stiffener (S). The stiffeners are disposed about the periphery of the 36 chip group. Accordingly, two separate 36 chip groups are disposed on opposite sides of the circuit board.

The retaining plate P has, as shown in FIG. 4B, a series of holes to allow the cooling studs F to protrude into the airflow stream. Tabs are placed about the perimeter of the retainer plate to allow adjacent retainer plates to share a common stiffener rib for purposes of mounting. The holes for the cooling studs are defined in a 6×6 array corresponding to the location of the studs above the 36 chip carrier.

The retaining plate has an elastomer backing for purposes of compressing the plate onto the assembly. Alternatively, a keeper plate having spring clips engaging the tops of the cooling studs may be employed to provide the necessary compression.

The cooling studs may alternatively be anchored by eliminating reflow soldering techniques to join the metal cap of the encapsulated chip. In such a modification, the studs are grooved to accept snap rings. The snap rings then anchor the cooling studs to the retainer plate. Since reflow solder coupling to the metal cap is not used, a thermal grease coating is applied to the contact surface of the cooling stud. An advantage in this technique is that the cooling stud is separable from the encapsulated chip and is made an integral part of the retainer plate. The elastomer material on the bottom of the retainer plate allows compression so that forced engagement of the cooling stud to the top of the encapsulated chip takes place.

FIG. 5 illustrates another modification of this invention to allow the inclusion of a thin ceramic support member for effectuating mechanical support and additional printed wiring capabilities. In FIG. 5A, a thin film wiring structure is processed on the surface of a thin ceramic support element. The thin ceramic is then laser scribed about its perimeter or along one edge thereof to allow for a subsequent breaking operation. As shown in FIG. 5A, the region within the laser scribed perimeter has a cr/cu/cr interface with the thin film wiring structure. The region external the laser scribed perimeter has a Cr/Al interface with the thin film structure. If desirable, the opposite surface of the thin ceramic can be processed utilizing known thick film techniques to effectuate power distribution patterns, including passive elements such as decoupling decapacitors or termination resistors. Via holes (L) and (M) are disposed in the Cr/Al interface. The aluminum is then dissolved at the interface of the ceramic and the thin film wiring structure and the ceramic segments outside the laser scribed regions are then broken off and discarded. This is shown in FIG. 5B. The thin film member may then be deflected for bonding to the next package level.

Accordingly, utilizing this modification, a replacement wire for bonding to the next package level is preprocessed in the system. This is accomplished while providing the necessary mechanical support and stability necessary to build-up device using the thick film. Also, the resulting metal film will not fold or wrinkle prior to use since it is supported by the thick film. Another advantage of this technique is that it provides a replacement wire that will easily compensate for physical size differences between layers. Naturally, it is possible to have the thin film member bonded to the next level of packaging without deflection by simply bonding directly to the next succeeding ceramic support element.

Accordingly, as a consequence of this invention, a repairable multi-level overlay wiring system for semiconductor chips is defined. By using the wiring paths, apertures between levels and engineering change pads together with the successive joining of levels as defined herein a unique packaging structure having exceptional versatility is defined.

It is apparent that a person of working skill in this technology would recognize further modifications of this structure without departing from the essential scope thereof.

We claim:

1. A multi-level integrated packaging structure for supporting and electrically interconnecting a plurality of integrated circuit chips comprising:

a primary planar support frame having a primary array of spaced areas, a wiring pattern disposed on said primary planar support frame providing connection contacts, engineering change wiring channels and contacts in spaces on said primary array between said spaced areas;

a plurality of secondary planar support frames equal in number to said spaced areas defining said spaced primary array, said plurality of secondary planar support frames being respectively positioned within said primary array, each of said secondary planar support frames having a secondary array of spaced areas, each of said secondary planar support frames containing a wiring pattern providing connection contacts, engineering change wiring channels and contacts in spaces on said secondary array between said secondary array of spaced areas;

a plurality of substantially planar single chip carriers disposed on said secondary arrays, each of said chip carriers containing at least an integrated circuit chip and having an array of exposed connection contact means, and containing wiring for electrically interconnecting said integrated circuit chip to said array of exposed connection contacts on said same single chip carrier;

first connection means for connecting each of said single chip carriers to predetermined connection contacts on said secondary planar support frames, and;

second connection means for connecting predetermined contacts of said secondary planar support frames to predetermined connection contacts of said primary planar support frame whereby repair and replacement of single chip carriers and engineering wiring changes are facilitated.

2. An improved multi-level integrated packaging structure for supporting and electrically interconnecting a plurality of integrated circuit chips comprising:

a tiered support structure having a primary support frame, a plurality of secondary planar support frames mounted on said primary support frame and a plurality of single chip carriers mounted on said secondary support planar frames;

said primary support frame and each of said secondary support frames having a wiring pattern providing connection contacts, engineering change wiring channels and contacts thereon;

integrated circuit chips mounted on said single chip carriers, said chip carriers having exposed contact means and, wiring for electrically interconnecting said integrated circuit chip to said contact means;

first connection means for connecting predetermined contacts of said single chip carriers to predetermined connection contacts on said secondary planar support frames, and;

second connection means for connecting predetermined contacts of said secondary planar support frames to predetermined contacts of said primary planar support frame.

3. The multi-level integrated packaging structure of claims 1 or 2 further comprising a printed circuit board and a first primary planar support frame with its associated multi-level integrated packaging structure mounted on one surface of said printed circuit board and a second primary planar support frame with its associated multi-level integrated packaging structure mounted on an opposite surface of said printed circuit board.

4. The multi-level integrated packaging structure of claims 1 or 2 wherein said single chip carriers comprise a plurality of insulating layers containing metallic wiring pattern to interconnect said exposed contact means with contacts on said integrated chips.

5. The multi-level integrated packaging structure of claim 4 wherein said exposed connection contact means comprise a pair of contact wells serially disposed with a fixed separation therebetween and wherein said wiring for electrically interconnecting said integrated circuit chip includes a land portion positioned within said insulating layers and adapted to be cut to isolate said contact wells.

6. The multi-level integrated packaging structure of claim 5 further including a distribution of pairs of said contact wells distributed about the edge of said single chip carrier.

7. The multi-level integrated packaging structure of claim 5 wherein said first connection means comprises a series of protrusions disposed on said secondary planar support frame positioned beneath said contact wells, said contact wells having reflow attach wells to establish electrical continuity between said contact wells and said protrusions, said protrusions defining a chip-to-chip wiring pattern.

8. The multi-level integrated packaging structure of claim 7 wherein said connection contacts comprise a series of engineering pads positioned on said secondary planar support frames, each of said engineering pads connected to a distinct protrusion.

9. The multi-level integrated packaging structure of claim 7 wherein said contacts on said secondary planar support frames comprise a series of contact well pairs, said protrusions and said contact well pairs defining a multi-level wiring interface.

10. The multi-level integrated packaging structure of claims 1 or 2 further comprising a cap associated with each chip, and a cooling stud attached to said cap.

11. The multi-level integrated packaging structure of claim 10 further comprising a retaining plate disposed on top of said single chip carriers, said plate having an array of holes allowing said cooling studs to protrude therethrough.

12. The multi-level integrated packaging structure of claim 11 wherein said cooling studs are an integral part of said retaining plate and, means to thermally couple said studs to said cap.

13. The multi-level integrated packaging structure of claims 1 or 2 wherein said single chip carrier comprises a leadless chip carrier.

14. The multi-level integrated packaging structure of claims 1 or 2 wherein said single chip carrier comprises a tape automated bond carrier.

15. The multi-level integrated packaging structure of claims 1 or 2 wherein said single chip carrier comprises a passivated face bonded chip carrier.

16. The multi-level integrated packaging structure of claims 1 or 2 wherein said single chip carriers comprise a mixture of leadless chip carriers, tape automated bond carriers and passivated face bonded chip carriers.

17. The multi-level integrated packaging structure of claims 1 or 2 further comprising a notch scribed along one edge of said secondary support frame.

18. The multi-level integrated packaging structure of claim 17 wherein said notch extends partially through a ceramic support layer of said secondary support frame wherein, when said ceramic support is broken along said notch, following processing, an interconnection wire is created.

* * * * *